United States Patent [19]
Jain

[11] Patent Number: 5,994,919
[45] Date of Patent: Nov. 30, 1999

[54] METHOD AND APPARATUS FOR REDUCING RINGING OF A DIGITAL SIGNAL DELIVERED OVER A TRANSMISSION LINE

[75] Inventor: Sandeep K. Jain, Rancho Cordova, Calif.

[73] Assignee: Intel Corporation, Santa Clara, Calif.

[21] Appl. No.: 08/941,618

[22] Filed: Sep. 30, 1997

[51] Int. Cl.⁶ .................. H03K 17/16; H03K 19/003
[52] U.S. Cl. .............................................. 326/30; 326/31
[58] Field of Search ............................. 326/30, 88, 87, 326/90, 31, 33

[56] References Cited

U.S. PATENT DOCUMENTS

| | | | |
|---|---|---|---|
| 5,563,539 | 10/1996 | Takase | 327/185 |
| 5,638,328 | 6/1997 | Cho | 365/189.05 |
| 5,801,550 | 9/1998 | Tanaka et al. | 326/87 |

*Primary Examiner*—Michael Tokar
*Assistant Examiner*—Peguy Jean Pierre
*Attorney, Agent, or Firm*—Blakely, Sokoloff, Taylor & Zafman LLP

[57] ABSTRACT

A clamping circuit is provided to reduce ringing of digital signals delivered over a transmission line. The clamping circuit includes a pair of transistors respectively connecting the transmission line to a pair of voltage supplies, such as a $V_{supply}$ and ground. The transistors are controllably enabled to connect the transmission line to $V_{supply}$ or ground in response to a transition in the digital signal present on the transmission line. That is, the transistor interconnecting the transmission line to ground is controllably enabled in response to a high-to-low transition so as to counteract ringing on the transmission line. Alternately, the transistor interconnecting the transmission line to $V_{supply}$ is controllably enabled in response to a low-to-high transition so as to counteract ringing on the transmission line.

17 Claims, 4 Drawing Sheets

METHOD AND APPARATUS FOR REDUCING RINGING OF A DIGITAL SIGNAL DELIVERED OVER A TRANSMISSION LINE

BACKGROUND OF THE INVENTION

1. Field of the Invention

This invention relates generally to interfacing electrical components, and, more particularly, to a dynamic clamping circuit.

2. Description of the Related Art

In the field of electronics, information is commonly communicated using digital waveforms that are ideally represented in FIG. 1 by a waveform that transitions between low and high values without distortion. In the real world, a variety of factors affect and undesirably distort the waveform from the idealized representation of FIG. 1. For example, digital signals communicated over relatively long transmission lines can be severely impacted by "ringing." Ringing is defined as a damped oscillation occurring in the signal as a result of a sudden change in the signal. Thus, as shown in FIG. 2, transitions in the digital waveform from low-to-high and high-to-low produce a damped oscillation immediately following the transition. In high frequency digital waveforms, the damped oscillation can last for a substantial period of the signal.

These damped oscillations in the waveform are generally undesirable because they reduce the speed of operation of the overall circuit. That is, no assurances can be given as to what the value of the digital signal will be during this damped oscillatory period, owing to the relatively large transitions in the digital waveform. Thus, if the damped oscillations are not removed from the digital waveform, then any circuitry receiving the digital waveform must wait a preselected period of time to ensure that the damped oscillations have died out sufficiently so as not to affect the value of the digital signal observed. This waiting is, of course, undesirable in that it slows the overall operation of the circuit.

Prior art devices have attempted to reduce the damped oscillations by providing a circuit to clamp the transmission line to the desired high and low levels in response to a transition in the input wave form. These circuits, however, have suffered from at least one significant shortcoming. These clamping circuits have a leakage or quiescent current that is continually present. That is, even when ringing is not present, the clamping circuit still consumes power. Leakage current is particularly problematic in electronic circuits intended for operation from a battery supply. As would be expected, leakage current in a device operating from a battery supply will significantly shorten the useable life before the battery needs to be recharged.

Additionally, these prior art circuits tend to be slow to operate, and for high frequency digital signals, slow operation of the clamping circuit may allow the most significant portion of the damped oscillation to occur before the clamping circuitry takes effect. The slow response of the clamping circuit increases the time required to stabilize the input waveform and remove the damped oscillations, slowing the operation of the overall circuit.

The present invention is directed to overcoming, or at least reducing the effects of, one or more of the problems set forth above.

SUMMARY OF THE INVENTION

In one aspect of the present invention, a clamping circuit includes a delay circuit adapted to receive a first signal transmitted over a transmission line and deliver a second signal after a preselected delay. A transistor has an enable input and is adapted to be coupled between a voltage supply and the transmission line. A driver circuit is coupled to receive the first and second signals and provide a signal to the enable input of the transistor to bias the transistor on for a period of time corresponding to the preselected delay.

In another aspect of the instant invention, a method is provided for reducing ringing of a signal delivered over a transmission line. The method includes detecting a transition from a first voltage level to a second voltage level in a signal delivered over the transmission line; coupling a first voltage source to the transmission line in response to detecting the transition; and uncoupling the first voltage source from the transmission line after a first preselected period of time.

BRIEF DESCRIPTION OF THE DRAWINGS

Other objects and advantages of the invention will become apparent upon reading the following detailed description and upon reference to the drawings in which.

Figure 1:
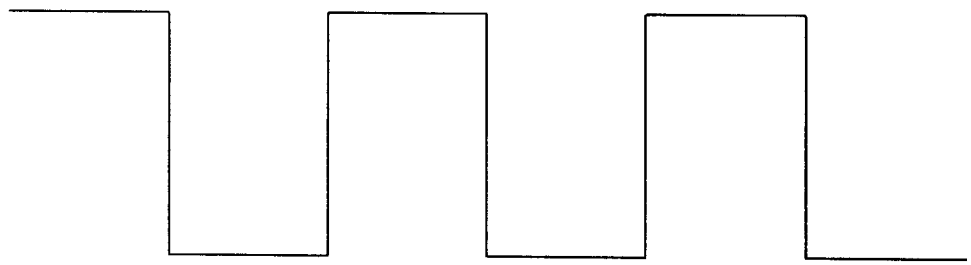
FIG. 1 is a stylized representation of a digital waveform.
Figure 2:
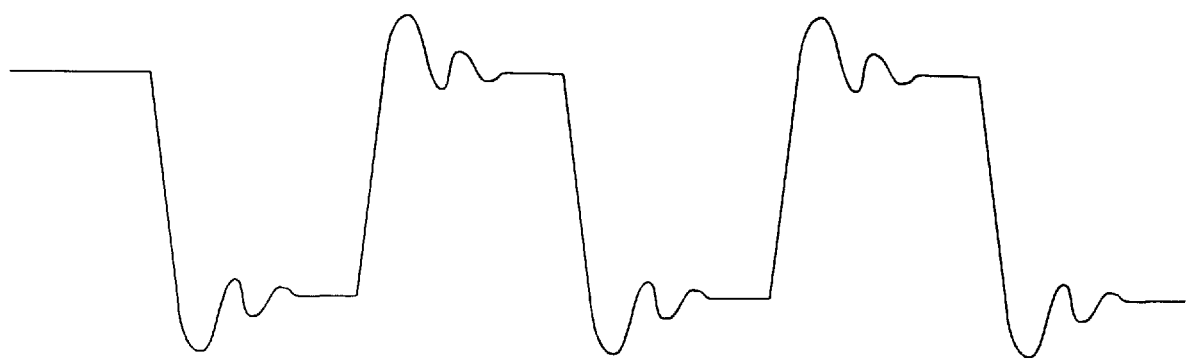
FIG. 2 is a representation of a digital waveform affected by ringing.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 3:
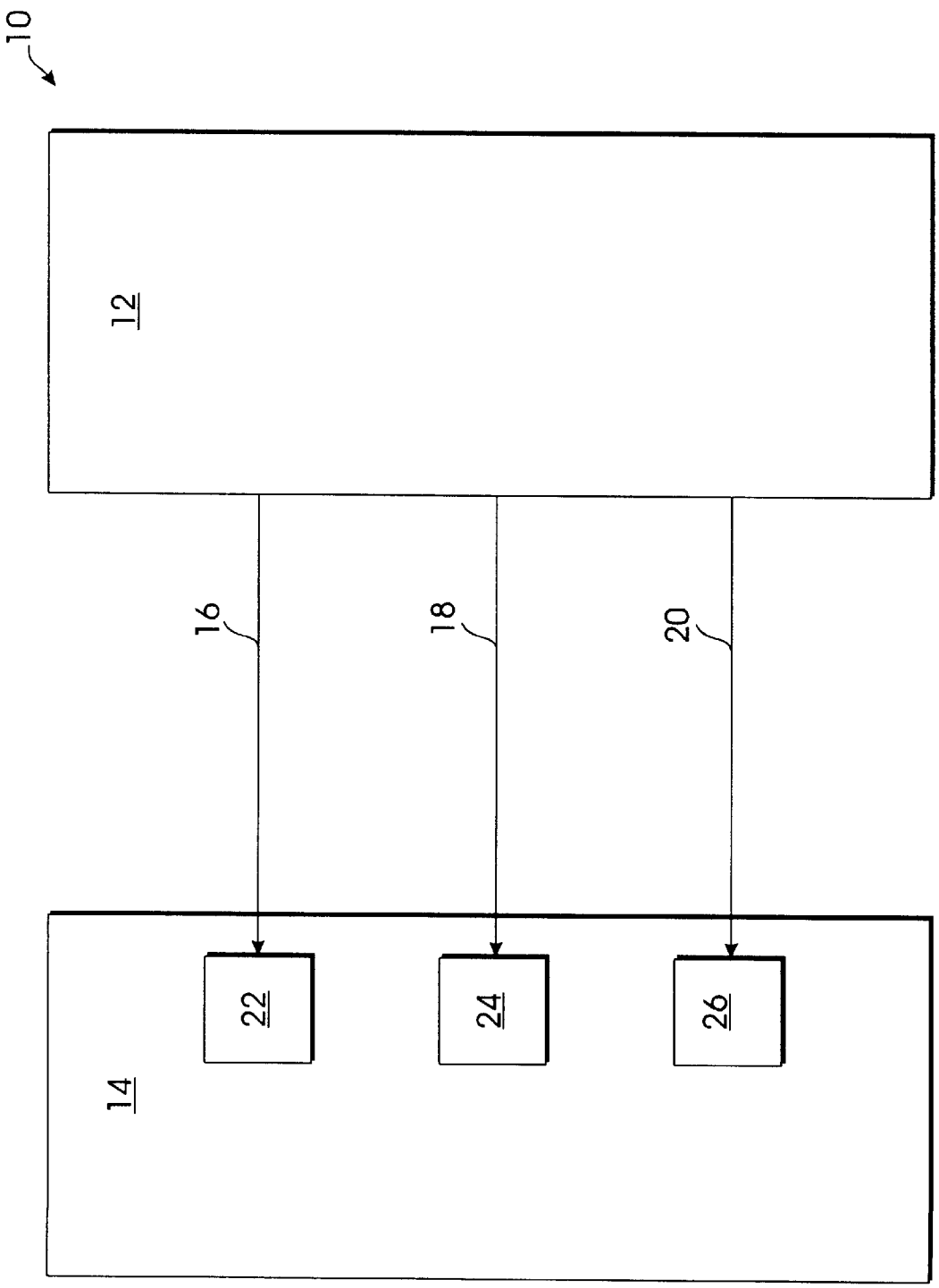
FIG. 3 is a block diagram of one embodiment of an electrical system.

Turning now to the drawings, and in particular to FIG. 3, a block diagram of an electronic system 10 is shown. The electronic system 10 includes a transmitter 12 and a receiver 14 interconnected by a plurality of transmission lines 16, 18, 20. The transmission lines 16, 18, 20 are connected to clamping circuits 22, 24, 26, respectively, within the receiver 14. The transmisison lines 16, 18, 20 can take on a variety of forms, including but not limited to, cables, wires, tracks on a printed circuit board, metal or semiconductor lines within a semiconductor chip, etc. The transmitter 12 and receiver 14 can take on a variety of forms, including but not limited to, a microprocessor, a chip set, memory, peripheral devices, etc.

Figure 4:
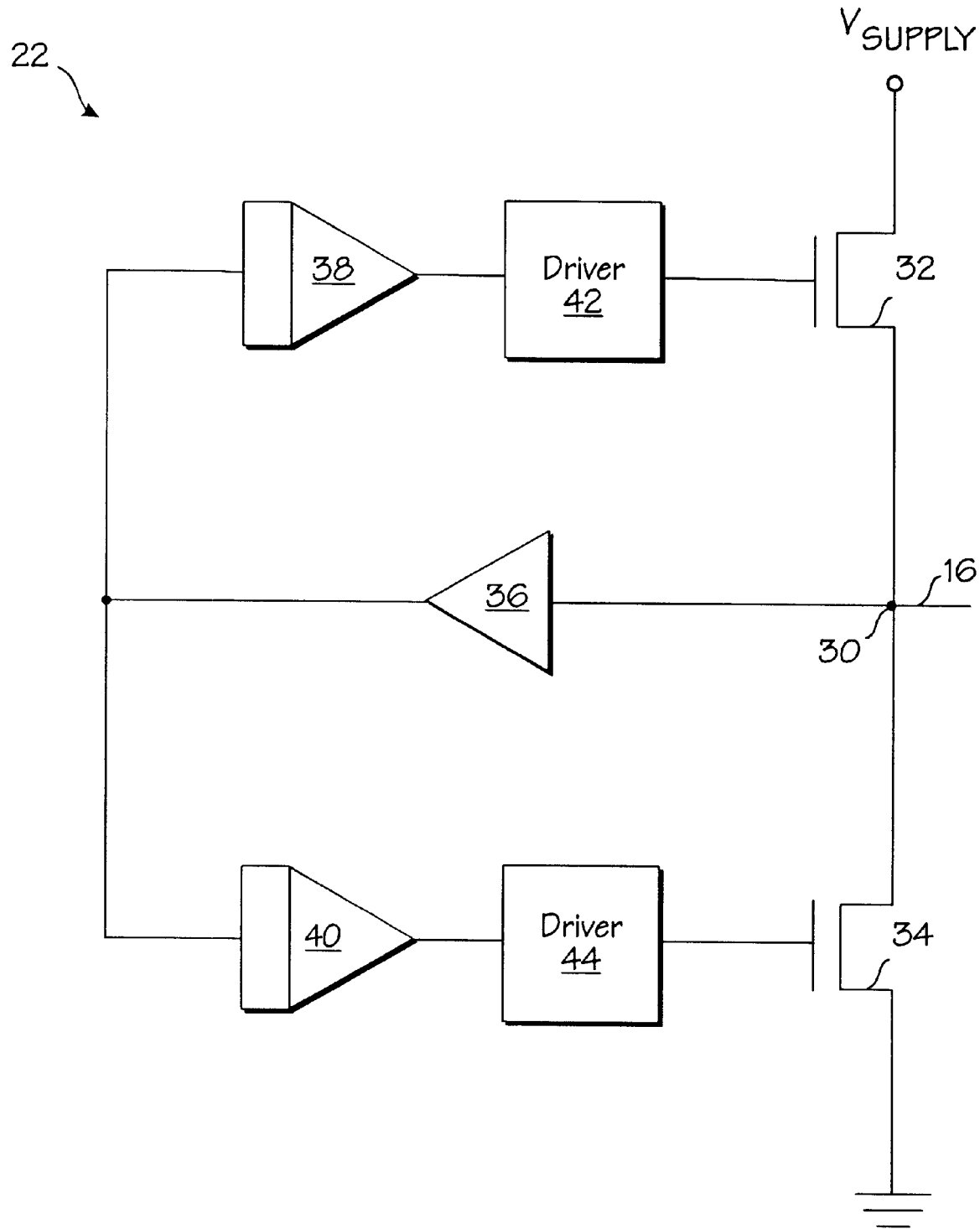
FIG. 4 is a stylized diagram of one embodiment of a clamping circuit used in an electrical system of the type shown in FIG. 3.

One embodiment of the clamping circuit 22 is illustrated in block diagram form in FIG. 4. The transmission line 16 is connected to a node 30 located between a pair of transistors 32, 34, which are serially connected between two voltage supplies, a voltage supply $V_{supply}$ and ground. The node 30 is also connected through a buffer 36 to a pair of delay circuits 38, 40. The delay circuits 38, 40 are respectively connected to drivers 42, 44, which in turn are connected to the enable inputs of the transistors 32, 34.

During normal operation of the clamping circuit 22, a transition in the waveform of a signal on the transmission line 16 is communicated, through the delay circuits 38, 40, to the drivers 42, 44. The driver 42 is configured to enable, or turn "on" the transistor 32 for a period of time corresponding to the period of the delay. The transistor 32 should be biased "on" at about the time of a low-to-high transition of the digital signal on the transmission line 16. When the transistor 32 is biased "on," the transmission line 16 is pulled toward $V_{supply}$ to counteract ringing present on the transmission line 16. In a first embodiment, the driver 42 biases the transistor 32 "on" for a preselected period of time after the waveform on the transmission line 16 experiences a high-to-low transition. One example of the first embodiment is shown in FIG. 5 and is discussed in greater detail below.

The period of time that the transistor 32 is biased "on" depends on a number of factors, including the length of the transmission line 16, the size of the transistor 32, and the value of $V_{supply}$. For example, in an embodiment where the length of the transmission line is 10 inches, the size of the transistor is 200×150 microns, and the voltage supply is 3.3 volts, the preselected period of time for the embodiment illustrated in FIG. 5 was selected to be in the range of 2–6 nanaseconds.

The delay circuit 40, the driver 44, and the transistor 34 operate in a manner similar to that described above with respect to the delay circuit 38, the driver 42, and the transistor 32, except that the delay circuit 40, the driver 44, and the transistor 34 are operated in response to a high-to-low transition of the waveform on the transmission line 16. That is, the delay circuit 40 operates in conjunction with the driver 44 to turn "on" the transistor 34 at about the time of a high-to-low transition of the waveform present on the transmission line 16. The driver 44 thereafter holds the transistor 34 "on" for a preselected period of time corresponding to the delay induced by the delay circuit 40. The delay circuit 40 need not have the identical delay period as that of the delay circuit 38. Rather, the delay periods associated with the delay circuits 38, 40 are selected to optimize the performance of the clamping circuit 22 for both high-to-low and low-to-high transitions.

Figure 5:
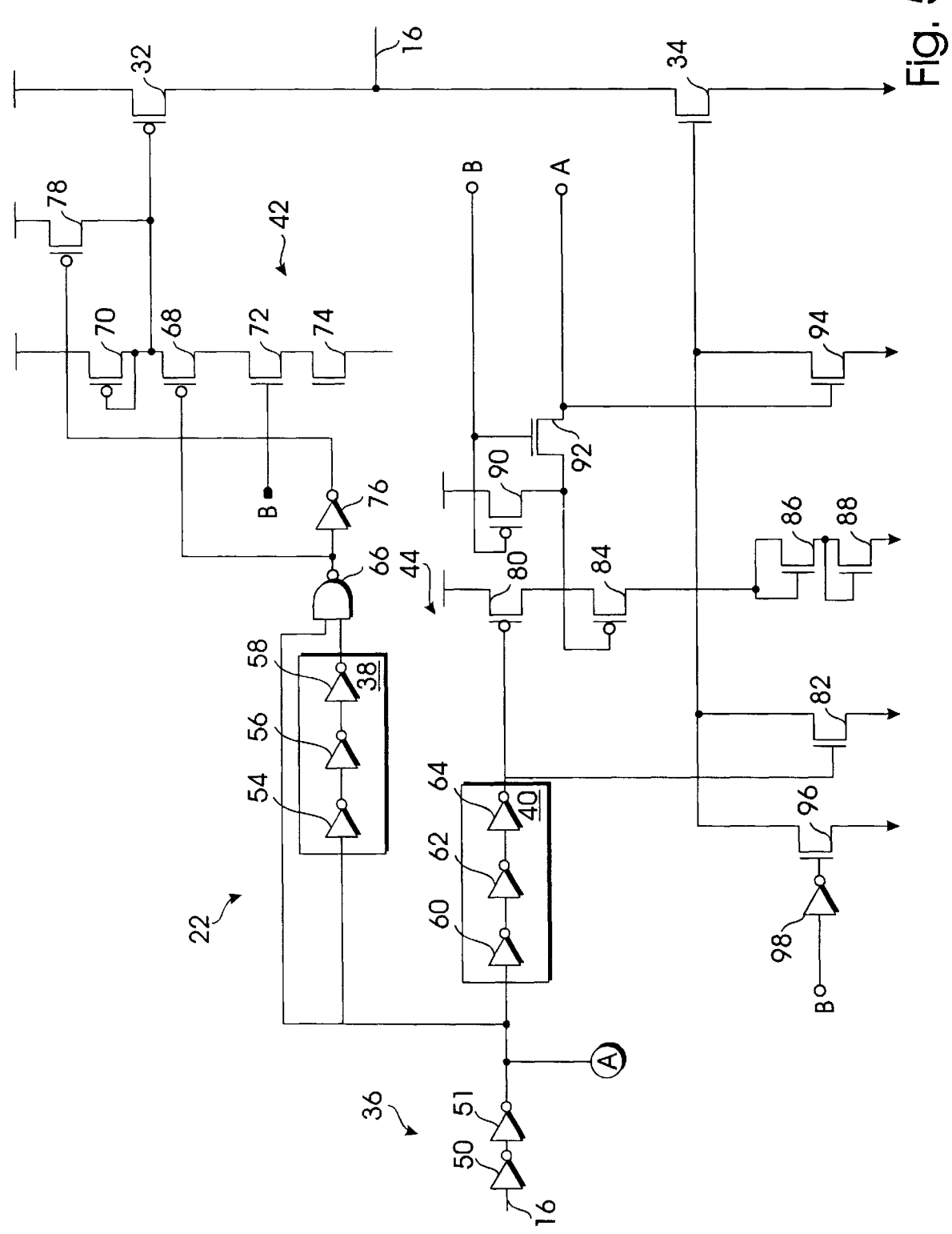
FIG. 5 is a schematic diagram of one embodiment of the clamping circuit of FIG. 2.

Turning now to FIG. 5, a schematic diagram of one embodiment of the clamping circuit 22 is illustrated. The transmission line 16 is connected to an input buffer 36, which is comprised of two inverters 50, 51. The output of the buffer 36 is connected to the delay circuits 38, 40, which are comprised of, in this embodiment, three serially connected inverters 54, 56, 58; 60, 62, 64. The number of inverters employed in the delay circuits 38, 40 is determined by the amount of desired delay, and consequently the time period for which it is desired that the transistors 32, 34 be biased "on."

The output of the buffer 36 is also delivered to a first input of a NAND gate 66. The second input of the NAND gate 66 is connected to the output of the delay circuit 38. The output of the NAND gate 66 is ultimately used to bias the transistor 32 "on" for a period of time corresponding to the delay induced by the three inverters 54, 56, 58. The output of the NAND gate 66 is delivered to a gate input of a PMOS transistor 68 connected in series with transistors 70, 72, 74 between the voltage supply $V_{supply}$ and ground. An inverter 76 has its input terminal connected to the output terminal of the NAND gate 66 and its output terminal connected to the gate of the NMOS transistor 74. The PMOS transistor 70 is connected as a diode, and the junction between the PMOS transistors 70, 68 is connected to the gate of the PMOS transistor 32 and to the voltage supply $V_{supply}$ through a PMOS transistor 78. The PMOS transistor 78 also has its gate connected to the output terminal of the inverter 76.

During normal operation, the PMOS transistor 32 is biased "on" in response to a low-to-high transition of a waveform on the transmission line 16. The input buffer 36 supplies a non-inverted representation of the waveform appearing on the transmission line 16. Thus, during a low-to-high transition on the transmission line 16, the output of the buffer 36 will be seen as a low-to-high transition. Assuming that the output of the buffer 36 has just transitioned to a low state, then the first and second inputs to the NAND gate 66 will both be low, as the output of the delay circuit 38 will not respond to a low state at its input until after the time it takes for the three inverters 54, 56, 58 to change states. The low inputs force the output of the NAND gate 66 to a high state, biasing the PMOS transistor 68 "off," and thereby connecting the voltage supply $V_{supply}$ to the gate of the PMOS transistor 32 through the transistor 70. Additionally, the output of the inverter 76 is in a low state, biasing the transistor 78 "on," thereby connecting the gate of the PMOS transistor 32 to the voltage supply $V_{supply}$ through the transistor 78. The two alternate connections of the gate of the transistor 32 to the voltage supply $V_{supply}$ ensures that the transistor 32 is biased "off" hard.

After the delay induced by the delay circuit 38, the first and second inputs to the NAND gate 66 are in a low and high state, respectively, forcing the output of the NAND gate 66 to remain in a high state. As discussed above, the high state at the output of the NAND gate 66 connects the voltage supply $V_{supply}$ to the gate of the PMOS transistor 32, biasing it "off."

Subsequently, the waveform on the transmission line 16 experiences a low-to-high transition, forcing the output of the buffer 36 to a high state. The first and second inputs to the NAND gate 66 are both in a high state (the delay circuit 38 prevents the second input to the NAND gate 66 from immediately transitioning to a low state), forcing the output of the NAND gate 66 to a low state. The low state at the output of the NAND gate 66 biases the transistor 68 "on" and forces the output of the inverter 76 to a high state, which biases the transistor 78 "off"and the transistor 74 "on." The transistor 72, during normal operation, is biased "on" by a high state control signal applied to an external input B connected to its gate. Thus, the transistors 68, 72, 74 are all biased "on," pulling the gate of the PMOS transistor 32 to ground and biasing it "on." Accordingly, the PMOS transistor 32 is turned "on" in response to a low-to-high transition in the waveform on the transmission line 16.

Subsequently, after the delay induced by the delay circuit 38, the first and second inputs to the NAND gate 66 are in a high and low state, respectively, forcing the output of the NAND gate 66 to a high state. Once again, the high state at the output of the NAND gate 66 biases the PMOS transistor 32 "off." Thus, the transistor 32 is biased "on" in response to a low-to-high transition in the waveform on the transmission line 16 and remains "on" for a period of time corresponding to the delay induced by the delay circuit 38. The delay circuit 38 can be altered to provide varying degrees of delay in accordance with the application intended for the latching circuit 22. That is, longer or shorter delays can be induced by altering the circuitry of the delay circuit 38, such as by increasing or reducing the number of inverters.

Turning now to the circuitry shown in the lower half of FIG. 5, the output of the delay circuit 40 is connected to the gate of a PMOS transistor 80 and the gate of an NMOS transistor 82. The NMOS transistor 82 is serially connected between ground and the gate of the NMOS transistor 34, and the PMOS transistor 80 is serially connected between the voltage supply $V_{supply}$ and the gate of the NMOS transistor 34 through a PMOS transistor 84 interposed therebetween. A pair of transistors 86, 88 are also connected between the gate of the NMOS transistor 34 and around, but are configured as diodes.

The gate of the PMOS transistor 84 is connected to the voltage supply $V_{supply}$ through a PMOS transistor 90, which has its gate connected to the input B. The gate of the PMOS transistor 84 is also connected to an inverted version of the waveform present on the transmission line 16 via the inverter 50 and an NMOS transistor 92. The gate of the NMOS transistor 92 is also connected to the input B. An NMOS transistor 94 is serially connected between the gate of the NMOS transistor 34 and ground, and has its gate connected to the node A. Finally, an NMOS transistor 96 is also coupled between the gate of the NMOS transistor 34 and ground, and has its gate connected through an inverter 98 to the input B.

During normal operation, the control signal applied to the input B is in a high state, which enables the operation of the latching circuit 22. If it is desired to disable the latching circuit 22 a low state control signal is applied to the input B. The low state at the input B biases the PMOS transistor 90 "on," coupling the gate of the PMOS transistor 84 to the voltage supply $V_{supply}$, thereby biasing the PMOS transistor 84 "off." With the PMOS transistor 84 biased "off," the gate of the NMOS transistor 34 cannot be connected to the voltage supply $V_{supply}$, and thus the NMOS transistor 34 cannot be biased "on."

During normal operation, the NMOS transistor 34 is biased "on" in response to a high-to-low transition of the waveform on the transmission line 16. The input buffer 36 supplies a noninverted representation of the waveform appearing on the transmission line 16. The delay circuit 40, however, supplies an inverted representation of the waveform appearing at the output of the buffer 36. Thus, during a high-to-low transition of the waveform on the transmission line 16, the output of the delay circuit 40 appears as a low-to-high transition, but delayed in time. Assuming that the waveform present on the transmission line 16 has just transitioned to a high state, then the output at the node A is in a high state, and the output of the delay circuit 40 is in a high state until the transition time of the delay circuit 40 has expired. The high state at the output of the delay circuit 40 biases the PMOS transistor 80 "off," and the transistor 82 "on," pulling the gate of the NMOS transistor 34 to ground and biasing it "off." Additionally, the high signal at the node A also biases the NMOS transistor 94 "on," providing an additional path from the gate of the NMOS transistor 34 to ground.

After the delay induced by the delay circuit 40, the output for the delay circuit 40 transitions to a low state, biasing the transistor 80 "on," and the transistor 82 "off." The node A, however, remains at a high state, biasing the PMOS transistor 84 "off." Additionally, the high state at the node A continues to bias the NMOS transistor 94 "on," pulling the gate of the NMOS transistor 34 to ground and biasing the NMOS transistor 34 "off."

Subsequently, the waveform on the transmission line 16 transitions to a low state, forcing the node A to a low state, while the output of the delay circuit 40 remains in its low state. Thus, the PMOS transistor 80 remains biased "on" by the output of the delay circuit 40, and the PMOS transistor 84 is likewise biased "on" by the low state at the node A. With the transistors 80, 84 biased "on," the voltage supply $V_{supply}$ is connected to the gate of the NMOS transistor 34, biasing the transistor 34 "on." With the transistor 34 biased "on," the transmission line 16 is pulled toward ground to counteract the ringing present on the transmission line 16.

After the delay induced by the delay circuit 40, the output of the delay circuit 40 transitions to a high state, biasing the PMOS transistor 80 "off" and the NMOS transistor 82 "on." With the transistor 82 biased "on," the gate of the NMOS transistor 34 is again pulled to ground and biased "off." Thus, a high-to-low transition in the waveform on the transmission line 16 induces the NMOS transistor 34 to be biased "on" for a period of time corresponding to the delay of the delay circuit 40.

The circuitry of the embodiment disclosed in FIG. 5 has been implemented using MOS transistors. However, it is envisioned that other types of transistors (such as bipolar junction transistors (BJT)) could be used in an embodiment without departing from the spirit and scope of the instant invention.

I claim:

1. A clamping circuit, comprising:
    a delay circuit adapted to receive a first signal transmitted over a transmission line and deliver a second signal after a preselected delay;
    a transistor having an enable input and being adapted to be coupled between a voltage supply and said transmission line; and
    a driver circuit coupled to receive said first and second signals and provide a signal to the enable input of said transistor to bias said transistor on for a period of time corresponding to said preselected delay.

2. The clamping circuit, as set forth in claim 1, wherein said driver circuit enables said transistor in response to said first signal transitioning from a first voltage level to a second voltage level.

3. The clamping circuit, as set forth in claim 2, wherein said first voltage level is a logically low voltage level and said second voltage is a logically high voltage level.

4. The clamping circuit, as set forth in claim 2, wherein said first voltage level is a logically high voltage level and said second voltage is a logically low voltage level.

5. The clamping circuit, as set forth in claim 1, including:
    a second transistor having an enable input and being adapted to be coupled between a second voltage supply and said transmission line; and
    a second driver circuit coupled to receive said first and second signals and provide a signal to the enable input of said second transistor to bias said transistor on for a period of time corresponding to said preselected delay.

6. The clamping circuit, as set forth in claim 1, including:
    a second delay circuit adapted to receive the first signal transmitted over the transmission line and deliver a third signal after a second preselected delay;

a second transistor having an enable input and being adapted to be coupled between a second voltage supply and said transmission line; and a second driver circuit coupled to receive said first and third signals and provide a signal to the enable input of said second transistor to bias said transistor on for a period of time corresponding to said second preselected delay.

7. The clamping circuit, as set forth in claim 1, wherein said preselected delay is in the range of about 2–6 nanoseconds.

8. A clamping circuit, comprising:

a delay circuit adapted to receive a first signal transmitted over a transmission line and deliver a second signal after a preselected delay;

a transistor having an enable input and being adapted to be coupled between a voltage supply and said transmission line; and means for receiving said first and second signals and biasing said transistor on for a period of time corresponding to said preselected delay.

9. The clamping circuit, as set forth in claim 8, wherein said biasing means includes means for biasing said transistor on for a preselected period of time corresponding to said preselected delay in response to a transition of said first signal from a first voltage level to a second voltage level.

10. The clamping circuit, as set forth in claim 9, wherein the first voltage level is a logically high voltage level and the second voltage level is a logically low voltage level.

11. The clamping circuit, as set forth in claim 9, wherein the first voltage level is a logically low voltage level and the second voltage level is a logically high voltage level.

12. A method performed by a clamping circuit for reducing ringing of a signal delivered over a transmission line, comprising:

receiving the signal delivered over the transmission line and generating a second signal after a preselected delay;

detecting a transition from a first voltage level to a second voltage level in the signal delivered over the transmission line using the second signal;

coupling a first voltage source to the transmission line in response to detecting the transition; and uncoupling the first voltage source from the transmission line after the preselected delay.

13. The method, as set forth in claim 12, wherein coupling a first voltage source includes biasing an enable input of a transistor coupled between the first voltage source and the transmission line.

14. The method, as set forth in claim 12, wherein detecting a transition from a first voltage level to a second voltage level includes detecting a transition from a logically high voltage level to a logically low voltage level.

15. The method, as set forth in claim 12, wherein detecting a transition from a first voltage level to a second voltage level includes detecting a transition from a logically low voltage level to a logically high voltage level.

16. The method, as set forth in claim 12, including:

detecting a second transition from a second logical level to a first logical level in a signal delivered over the transmission line;

coupling a second voltage source to the transmission line in response to detecting the second transition; and uncoupling the second voltage source from the transmission line after a second preselected period of time.

17. An electrical system comprising:

a transmitter:

a receiver;

a transmission line interconnecting said transmitter and receiver, and a clamping circuit located within said receiver and coupled to said transmission line, said clamping circuit comprising:

a delay circuit adapted to receive a first signal transmitted over the transmission line and deliver a second signal after a preselected delay;

a transistor having an enable input and being adapted to be coupled between a voltage supply and said transmission line; and a driver circuit coupled to receive said first and second signals and provide a signal to the enable input of said transistor to bias said transistor on for a period of time corresponding to said preselected delay.

* * * * *

UNITED STATES PATENT AND TRADEMARK OFFICE
CERTIFICATE OF CORRECTION

PATENT NO. : 5,994,919
DATED : November 30, 1999
INVENTOR(S) : Jain

It is certified that error appears in the above-identified patent and that said Letters Patent is hereby corrected as shown below:

Column 5,
Line 18, delete "around", insert -- ground --.

Signed and Sealed this

Tenth Day of June, 2003

JAMES E. ROGAN
*Director of the United States Patent and Trademark Office*